United States Patent [19]

Fobbester

[11] Patent Number: 5,663,989
[45] Date of Patent: Sep. 2, 1997

[54] CONTROL ARRANGEMENTS FOR DIGITAL RADIO RECEIVERS

[75] Inventor: Ian Godfrey Fobbester, Gloucestershire, United Kingdom

[73] Assignee: Plessey Semiconductors Limited, United Kingdom

[21] Appl. No.: 324,910

[22] Filed: Oct. 18, 1994

[30] Foreign Application Priority Data

Oct. 28, 1993 [GB] United Kingdom ............ 9322181
Jan. 17, 1994 [GB] United Kingdom ............ 9400762

[51] Int. Cl.$^6$ ............................................. H04L 27/06
[52] U.S. Cl. .................. 375/344; 375/316; 455/182.2; 455/192.2
[58] Field of Search .................... 375/344, 316; 455/182.2, 192.2, 164.1

[56] References Cited

U.S. PATENT DOCUMENTS

| | | | |
|---|---|---|---|
| 4,544,894 | 10/1985 | Yoshida | 329/122 |
| 4,817,195 | 3/1989 | Kubo et al. | 455/192.2 |
| 4,873,702 | 10/1989 | Chiu | 375/316 |
| 5,109,544 | 4/1992 | Mittel et al. | 455/182.2 |
| 5,335,354 | 8/1994 | Koike | 455/182.2 |

FOREIGN PATENT DOCUMENTS 0 430 480 A2  6/1991  European Pat. Off.

OTHER PUBLICATIONS

Patent Abstracts of Japan, Unexamined Applications, E Section, vol. 15, No. 506, Dec. 20, 1991, The Patent Office Japanese Government, p. 26, E 1148; & JP-A-03 220 823, Japan Radio.

*Primary Examiner*—Stephen Chin
*Assistant Examiner*—T. Ghebretinsae
*Attorney, Agent, or Firm*—Kirschstein, et al.

[57] ABSTRACT

In a frequency modulated digital radio transmission system, frequency differences between transmitter and receiver which give rise to DC offsets at the output of the demodulator are countered for any one data transmission by establishing a frequency controlling or DC level controlling signal during a preamble sequence having a known constant DC component, such as the sequence 10101 - - - used for clock or data synchronization, and retaining that controlling signal substantially unaltered for use during the remainder of that data transmission.

5 Claims, 3 Drawing Sheets

CONTROL ARRANGEMENTS FOR DIGITAL RADIO RECEIVERS

BACKGROUND OF THE INVENTION

A problem arises in digital FM radio receivers in that demodulated data may be superimposed on a DC level which is dependent on frequency differences between oscillators in the transmitter and receiver. The DC level will also be subject to drift with time and temperature. When a comparator is used to slice the demodulated data signal, which is usually almost sinusoidal for the highest frequency data pattern, considerable pulse stretching will occur as the slicing point on the data moves with DC level. AC coupling can be used with DC restoration but is always less than perfect and introduces a degree of timing jitter on the recovered data, particularly when the demodulated data contains amplitude variations which may be introduced as the data rate approaches the maximum obtainable from the channel bandwidth.

In a radio system where a number of transmitters and receivers communicate together on a network using frequency hopping, rapid switches in channel frequency and from transmit to receive are required. A conventional AFC system would be difficult to use in these circumstances as considerable time would be lost waiting for the system to recover after each frequency step or switch to receive function. Any AFC system used with digital modulation cannot respond to the average DC output level as this varies with data content and would produce a variable slicing level. Peak sensing of the data out could be used but this is also subject to variation as the channel limits are approached, as mentioned in the previous paragraph.

SUMMARY OF THE INVENTION

According to the present invention in a receiver arrangement for a frequency modulated digital data radio transmission system in which each data transmission commences with a predetermined sequence of digital values, there are provided control means comprising means to derive a correction factor for DC offsets pertaining at the output of a demodulator of the receiver arrangement during a said predetermined sequence and means to retain said correction factor substantially unaltered during the remainder of the respective data transmission.

The correction factor may be applied to control the tuning of the demodulator of the receiver arrangement or may be applied to circuit means arranged to counter said DC offsets. Said circuit means may comprise a level shift circuit. The means to derive the correction factor may comprise a protocol controller in the receiver arrangement.

In a system in which all transmitters and receivers are crystal controlled short term drift would be negligible and it would only be necessary to apply the correction at the commencement of communication between a transmitter/receiver pair, when a balanced code of say 101010 data can be transmitted to obviate problems with amplitude and average DC level at the demodulator output. A control loop may be formed to incorporate a memory such that during the preamble at the beginning of communication between a particular transmitter/receiver pair a frequency correction factor can be derived such as effectively to cancel DC level offset at the demodulator output for the duration of the transmission. The same frequency correction factor could be retained if the direction of communication between the transmitter/receiver pair is reversed.

BRIEF DESCRIPTION OF THE DRAWINGS

Control arrangements for frequency modulated digital data radio receivers will now be described way of example with reference to the accompanying drawings, of which.

DETAILED DESCRIPTION OF THE PREFERRED EMBODIMENT

Figure 1:
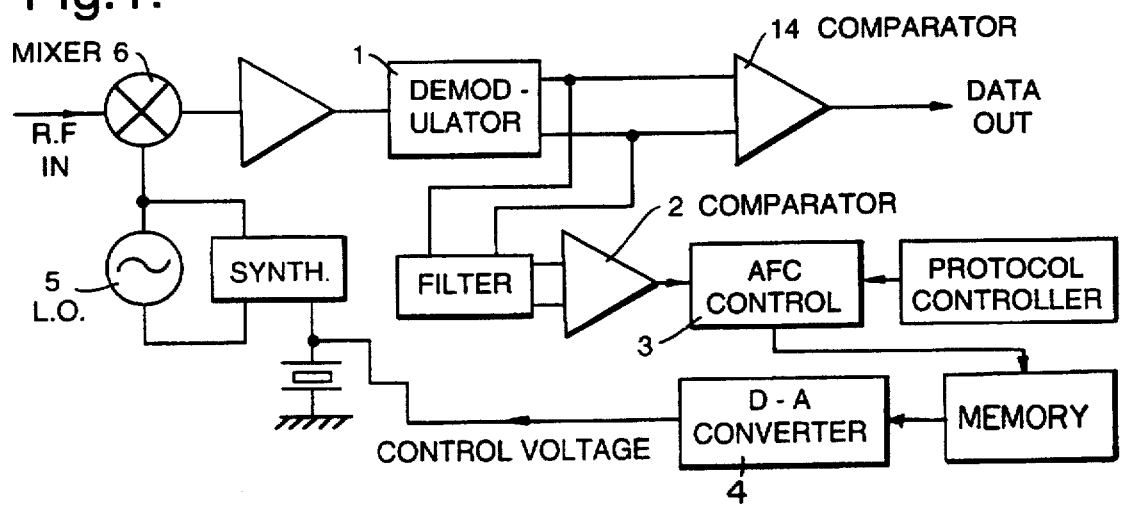
FIGS. 1 and 2 show respective control arrangements in which a correction factor is applied to control the tuning of a demodulator of a receiver.
Figure 2:
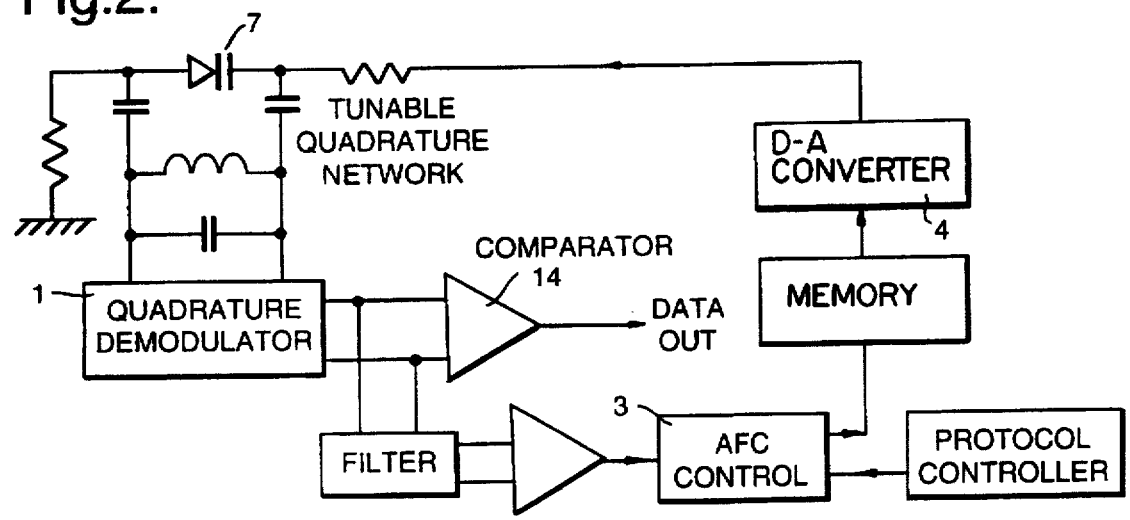

Referring to the drawings, in the control arrangement shown in FIG. 1 the output of a demodulator 1 is applied by way of a comparator 2 to an automatic frequency control circuit 3, which is arranged to apply a frequency controlling signal by way of a digital to analogue convertor 4 to "pull" the frequency of a crystal controlled local oscillator 5 to match that of an incoming RF signal applied to a mixer 6. In the arrangement shown in FIG. 2 a similar control loop is used to control the capacitance of a varactor diode 7 in a tuned circuit used to produce quadrature reference signals in the demodulator 1.

Figure 3:
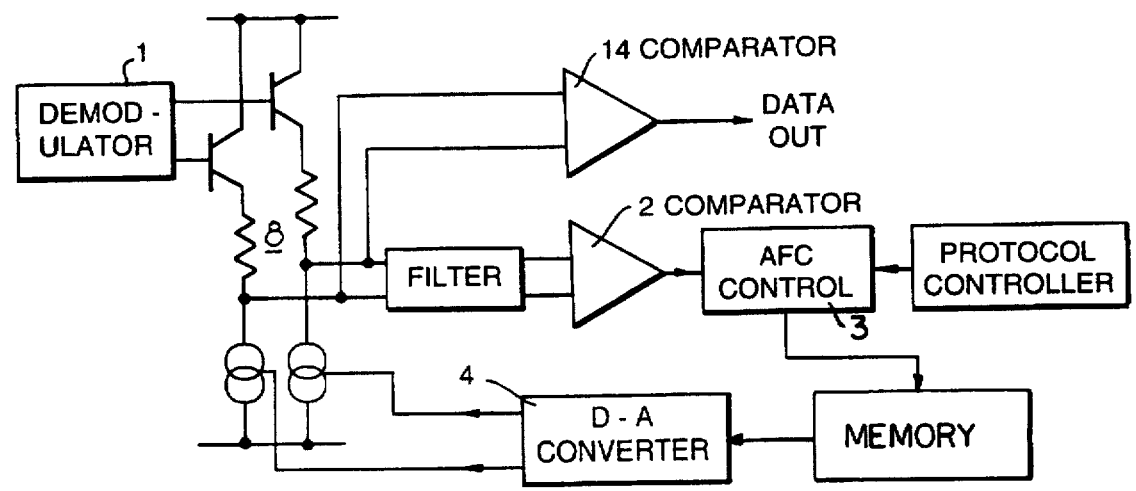
FIGS. 3, 4 and 5 show control arrangements in which a correction factor is applied to counter DC offsets at the output of a demodulator of a receiver.
Figure 4:
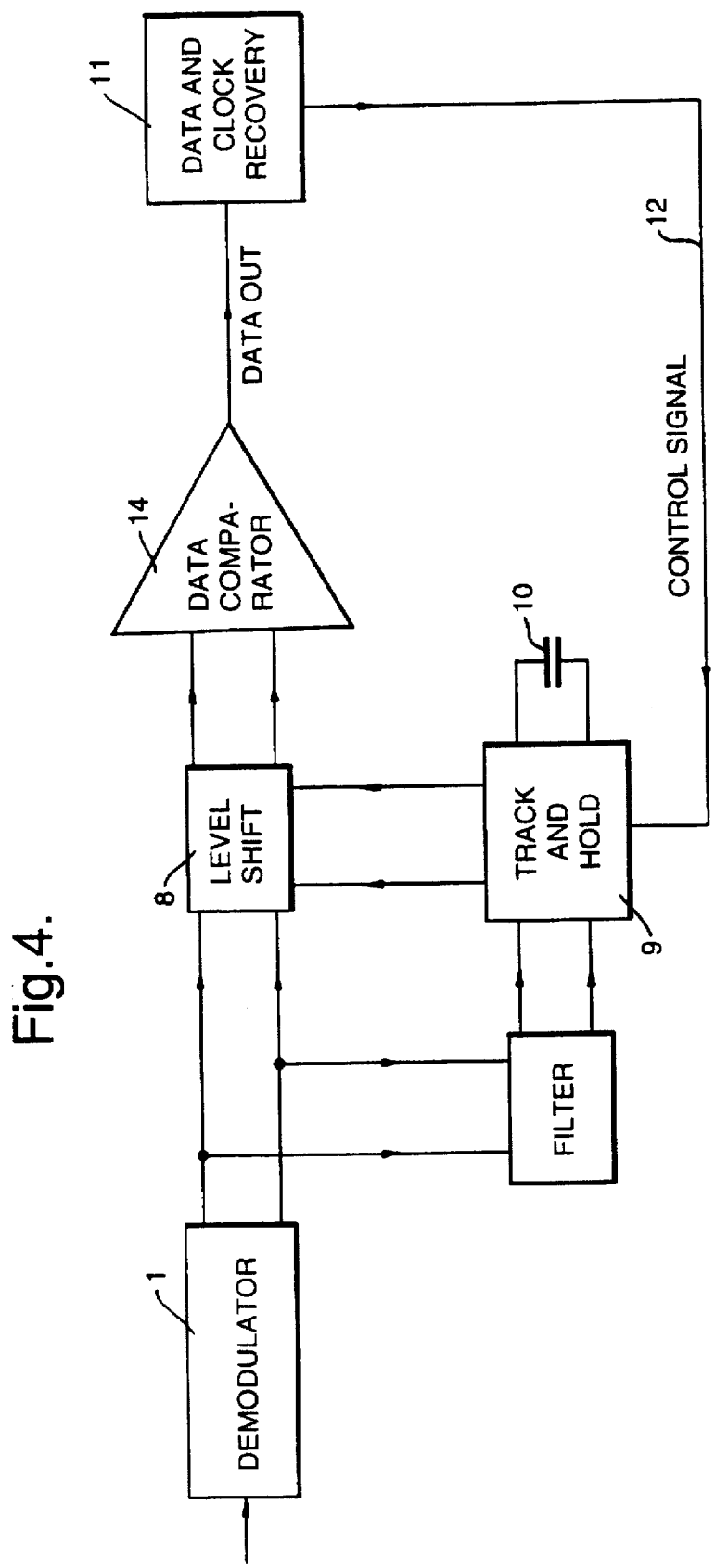
Figure 5:
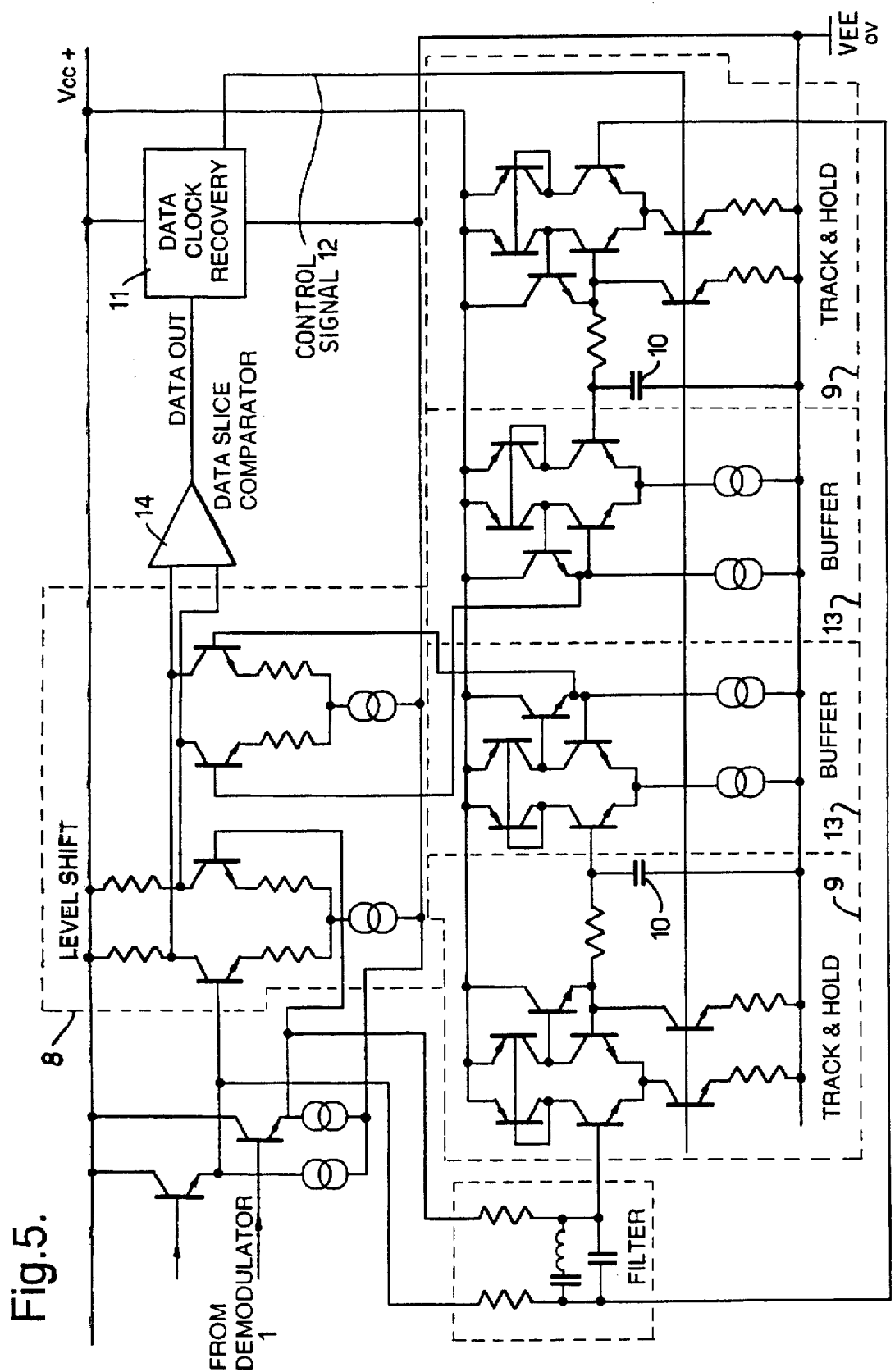

In the arrangements shown in FIG. 3 and in FIGS. 4 and 5 a similar control loop is arranged to add a DC component to each of the outputs of a differential demodulator 1, by means of a level shift circuit 8, to bring these outputs to similar DC levels without affecting the data components. In the arrangement shown in FIG. 3 the values of the added DC components are controlled by the output of a digital to analogue convertor 4, whereas in the arrangement shown in FIGS. 4 and 5 a pair of track and hold circuits 9 are arranged to develop on respective capacitors 10 (FIG. 5) potentials corresponding to the average levels on respective differential outputs of a demodulator 1. The track and hold circuits 9 are biased into the track mode by means of a control signal from a data and clock recovery circuit 11 over a path 12 until such time as the circuit 11 indicates that a suitable number of pulse edges with correct timing have been received, denoting the recognition of a valid preamble. The control signal on the path 12 then switches the circuits 9 to the hold mode during which the potentials on the capacitors 10 remain substantially unaltered.

The potentials on the capacitors 10 are applied by way of respective buffer amplifiers 13 (FIG. 5) to differential level shift circuits 8 which effectively remove any DC offset from the signals passed to a data comparator 14. Since these potentials are held at a constant level except during the preamble, the control arrangement is prevented from responding to the variable DC content of the data block.

I claim:

1. A receiver arrangement for a frequency modulated data transmission system in which each data transmission commences with a predetermined sequence of digital data values, comprising:

a demodulator having first and second outputs, and operative for generating demodulated signal levels at said first and second outputs;

a comparator for deriving digital data values from the demodulated signal levels at said first and second outputs of said demodulator;

means responsive to the demodulated signal levels at said first and second outputs during said predetermined sequence of the digital data values for deriving a D.C. offset value;

and means subsequently for retaining said D.C. offset value as a correction factor for the demodulated signal levels at said first and second outputs of said demodulator during a data transmission.

2. The receiver arrangement in accordance with claim 1, wherein said demodulator comprises a quadrature demodulator having a controllable-frequency tuned circuit; and further comprising means for applying said correction factor as a frequency control voltage for said tuned circuit.

3. The receiver arrangement in accordance with claim 1; and further comprising a controllable-frequency local oscillator and a mixer means for providing signals to said demodulator; and further comprising means for applying said correction factor as a frequency control voltage for said local oscillator.

4. The receiver arrangement in accordance with claim 1; and further comprising a data recovery circuit; a controllable D.C. level shift circuit; means for connecting said D.C. level shift circuit between said outputs of said demodulator and said data recovery circuit; and means for applying said correction factor to control said D.C. level shift circuit.

5. The receiver arrangement in accordance with claim 4, wherein said means for deriving the D.C. offset value comprises respective track and hold circuits connected to said first and second outputs of said demodulator to derive respective average D.C. levels from the respective demodulated signal levels at said first and second outputs during said predetermined sequence of the digital data values.

* * * * *